(12) United States Patent
Jacob et al.

(10) Patent No.: US 10,665,281 B1
(45) Date of Patent: May 26, 2020

(54) RESISTIVE NONVOLATILE MEMORY CELLS WITH SHARED ACCESS TRANSISTORS

(71) Applicant: GLOBALFOUNDRIES Inc., Grand Cayman (KY)

(72) Inventors: Ajey Poovannummoottil Jacob, Watervliet, NY (US); Amogh Agrawal, West Lafayette, IN (US); Bipul C. Paul, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/286,942

(22) Filed: Feb. 27, 2019

(51) Int. Cl.
*G11C 11/16* (2006.01)
*H01L 27/22* (2006.01)

(52) U.S. Cl.
CPC ...... *G11C 11/1659* (2013.01); *G11C 11/1675* (2013.01); *H01L 27/228* (2013.01); *G11C 11/161* (2013.01)

(58) Field of Classification Search
None
See application file for complete search history.

(56) References Cited

U.S. PATENT DOCUMENTS

| 2011/0228595 A1* | 9/2011 | Rao | G11C 8/08 365/158 |
| 2012/0033490 A1* | 2/2012 | Rao | G11C 11/16 365/171 |
| 2016/0172024 A1* | 6/2016 | Ma | G11C 11/56 365/148 |

OTHER PUBLICATIONS

Li et al., "Variation-Tolerant Spin-Torque Transfer (STT) MRAM Array for Yield Enhancement," IEEE 2008 Custom Integrated Circuits Conference (CICC).

* cited by examiner

*Primary Examiner* — Tan T. Nguyen
(74) *Attorney, Agent, or Firm* — Amerson Law Firm, PLLC

(57) ABSTRACT

A device is disclosed including a first resistive storage element, a first access transistor having a first terminal coupled to the first resistive storage element at a first node, a second resistive storage element, a second access transistor having a first terminal coupled to the second resistive storage element at a second node, and a write assist transistor having a first terminal coupled to the first node and a second terminal coupled to the second node.

20 Claims, 6 Drawing Sheets

US 10,665,281 B1

RESISTIVE NONVOLATILE MEMORY CELLS WITH SHARED ACCESS TRANSISTORS

BACKGROUND

Generally, the present disclosure relates to semiconductor devices, and, more specifically, to various novel resistive nonvolatile memory cells with shared access transistors and methods of operating the resistive nonvolatile memory cells.

A resistive memory cell may store information by changing the electrical resistance of a non-volatile memory device, for example, a magnetic tunnel junction (MTJ) element. The MTJ element typically includes a thin insulating tunnel barrier layer sandwiched between a magnetically fixed layer and a magnetically free layer, forming a magnetic tunnel junction. Magnetic orientations of the fixed and free layers may be perpendicular to the growth direction, forming a perpendicular MTJ (or pMTJ) element.

Spin transfer torque (STT) or spin transfer switching, uses spin-aligned ("polarized") electrons to directly apply a torque on the MTJ layers. Specifically, when electrons flowing into a layer have to change spin direction, a torque is developed and is transferred to the nearby layer. The resistance of the MTJ element changes when the spin direction of that layer changes. Other examples of such resistive non-volatile memory devices include memristors (used in ReRAMs) and phase-change (PC) materials (used in PC-RAMs).

Resistive memory cells are typically provided as addressable bit cells in an array of columns and rows. Such an array is provided with corresponding source lines, bit lines and word lines to perform operations on selected bit cells. Typically, each column of memory cells is provided with a dedicated source line and a dedicated bit line. As technology scales, there is difficulty in reducing the amount of chip area and height used by such memory cell arrays. Tis is due to the fact that a relatively large current is required to write into a resistive memory cell to provide the desired current for it to switch from one state to the other. For example, for an MTJ element, a minimum current is required to produce enough torque to switch the magnetic orientation of the cell. The access transistor for writing to the resistive memory cell is sized according to these current demands, which limits the scalability of the cell layout.

SUMMARY

The present disclosure is directed to various novel resistive memory cells with shared access transistors and methods of operating the resistive memory cells that may solve or reduce one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative device includes a first resistive storage element, a first access transistor having a first terminal coupled to the first resistive storage element at a first node, a second resistive storage element, a second access transistor having a first terminal coupled to the second resistive storage element at a second node, and a write assist transistor having a first terminal coupled to the first node and a second terminal coupled to the second node.

Another illustrative device includes a first resistive storage element, a first access transistor having a first terminal coupled to the first resistive storage element at a first node, a second resistive storage element, a second access transistor having a first terminal coupled to the second resistive storage element at a second node, a first write assist transistor having a first terminal coupled to the first node and a second terminal coupled to the second node, a third resistive storage element, a third access transistor having a first terminal coupled to the third resistive storage element at a third node, a fourth resistive storage element, a fourth access transistor having a first terminal coupled to the fourth resistive storage element at a second node, a second write assist transistor having a first terminal coupled to the third node and a second terminal coupled to the fourth node, a first word line coupled to gate terminals of the first and second access transistors, and a second word line coupled to gate terminals of the third and fourth access transistors.

A method of operating a device including a first resistive storage element, a first access transistor having a first terminal coupled to a first terminal of the first resistive storage element at a first node, a second resistive storage element, a second access transistor having a first terminal coupled to a first terminal of the second resistive storage element at a second node, and a write assist transistor having a first terminal coupled to the first node and a second terminal coupled to the second node is disclosed, the method including enabling the first access transistor, the second access transistor, and the write assist transistor during a first write operation to the first resistive storage element, and providing a second terminal of the second resistive storage element at a high impedance state during the first write operation.

BRIEF DESCRIPTION OF THE DRAWINGS

The disclosure may be understood by reference to the following description taken in conjunction with the accompanying drawings, in which like reference numerals identify like elements, and in which.

Figure 1:
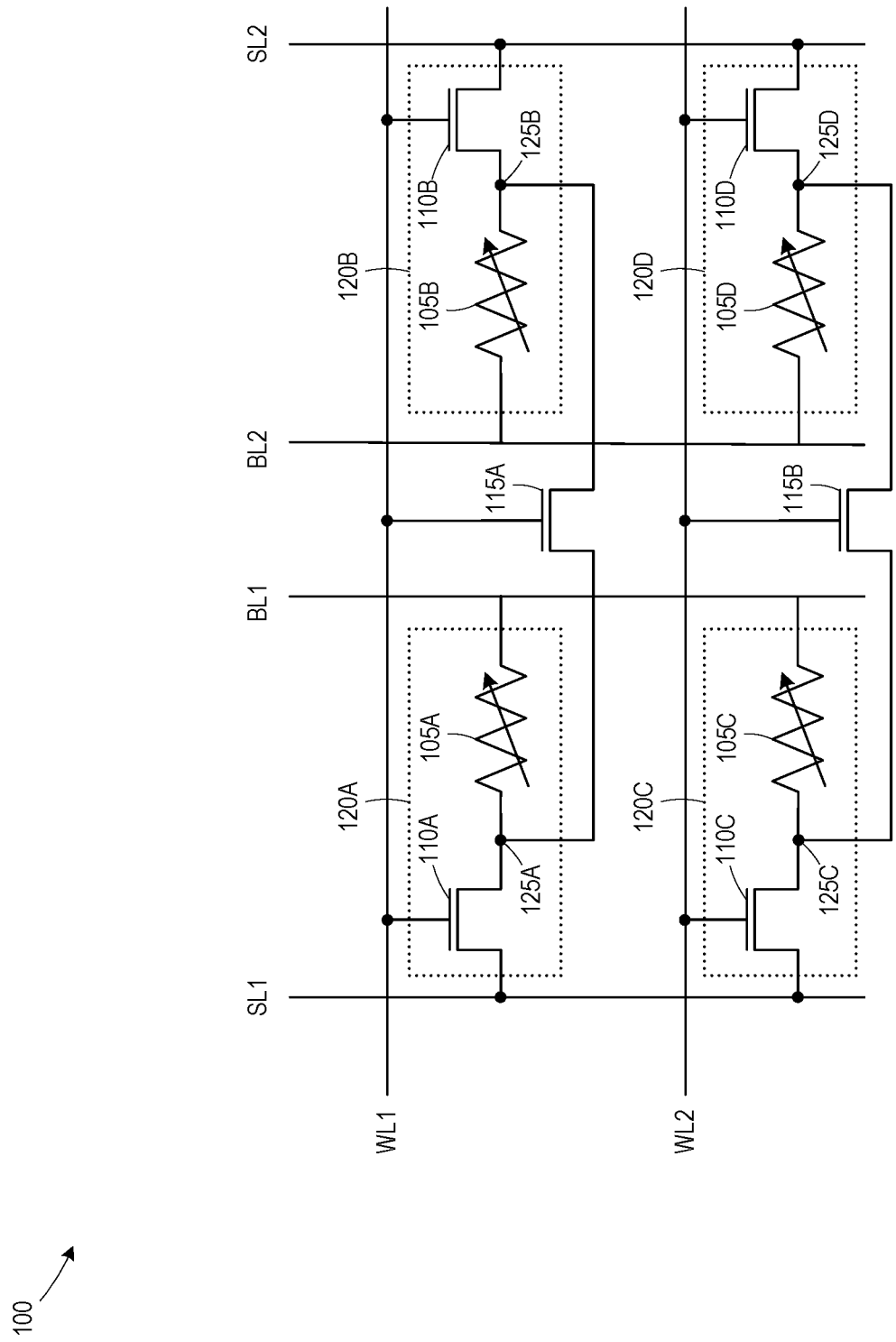
FIG. 1 is a circuit diagram of a resistive memory device with shared access transistors, according to some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the integrated circuit devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 1 is a circuit diagram of a resistive memory device 100, according to some embodiments described herein. The resistive memory device 100 includes resistive storage elements 105A-105D, access transistors 110A-110D, and write assist transistors 115A-115B arranged in cells 120A-120D. In some embodiments, each write assist transistor 115A, 115B is shared across two cells 120A-120D.

In some embodiments, the resistive storage elements 105A-105D are spin-transfer torque magnetic random access memory (STT-MRAM) devices. An STT-MRAM element includes a reference layer and a free layer separated by a barrier layer. A magnetic field of the reference layer is fixed. A magnetic field of the free layer is modulated to define the state of the memory element. The STT-MRAM element has a parallel, or low resistance, state when the magnetic fields of the reference layer and the free layer are aligned, and an anti-parallel, or high resistance, state when the magnetic fields of the reference layer and the free layer are opposite one another.

In some embodiments, the access transistors 110A-110D and the write assist transistors 115A-115B are metal oxide semiconductor (MOS) transistors, such as an n-type MOS transistor, and each includes a gate or control terminal, a first source/drain (S/D) terminal, and a second source/drain (S/D) terminal. In some embodiments, the access transistors 110A-110D and the write assist transistors 115A-115B are planar devices, such as planar semiconductor-over-insulator (SOI) devices. In some embodiments, the access transistors 110A-110D and the write assist transistors 115A-115B are formed as finFET devices, gate-all-around (GAA) devices, or other suitable structures.

The write assist transistor 115A is coupled to a node 125A defined between the access transistor 110A and the resistive storage element 105A and to a node 125B defined between the access transistor 110B and the resistive storage element 105B. The write assist transistor 115B is coupled to a node 125C defined between the access transistor 110C and the resistive storage element 105C and to a node 125D defined between the access transistor 110D and the resistive storage element 105D. The access transistors 110A, 110C are coupled between a source line SL1 and the respective resistive storage elements 105A, 105C. The access transistors 110B, 110D are coupled between a source line SL2 and the respective resistive storage elements 105B, 105D. Gate terminals of the access transistors 110A, 110B are coupled to a word line WL1, and gate terminals of the access transistors 110C, 110D are coupled to a word line WL2. The resistive storage elements 105A, 105C are coupled between the respective access transistors 110A, 110C and a bit line BL1, and the resistive storage elements 105B, 105D are coupled between the respective access transistors 110B, 110D and a bit line BL2.

In general, the write assist transistor 115A couples both associated access transistors 110A, 110B to a selected one of the resistive storage elements 105A, 105B during a write operation to provide increased write current. Due to the increased write current facilitated by the sharing of the access transistors 110A, 110B, the physical size of the access transistors 110A, 110B may be reduced as compared to a cell with a single access transistor, thereby reducing footprints of the cells 120A, 120B.

Figure 2:
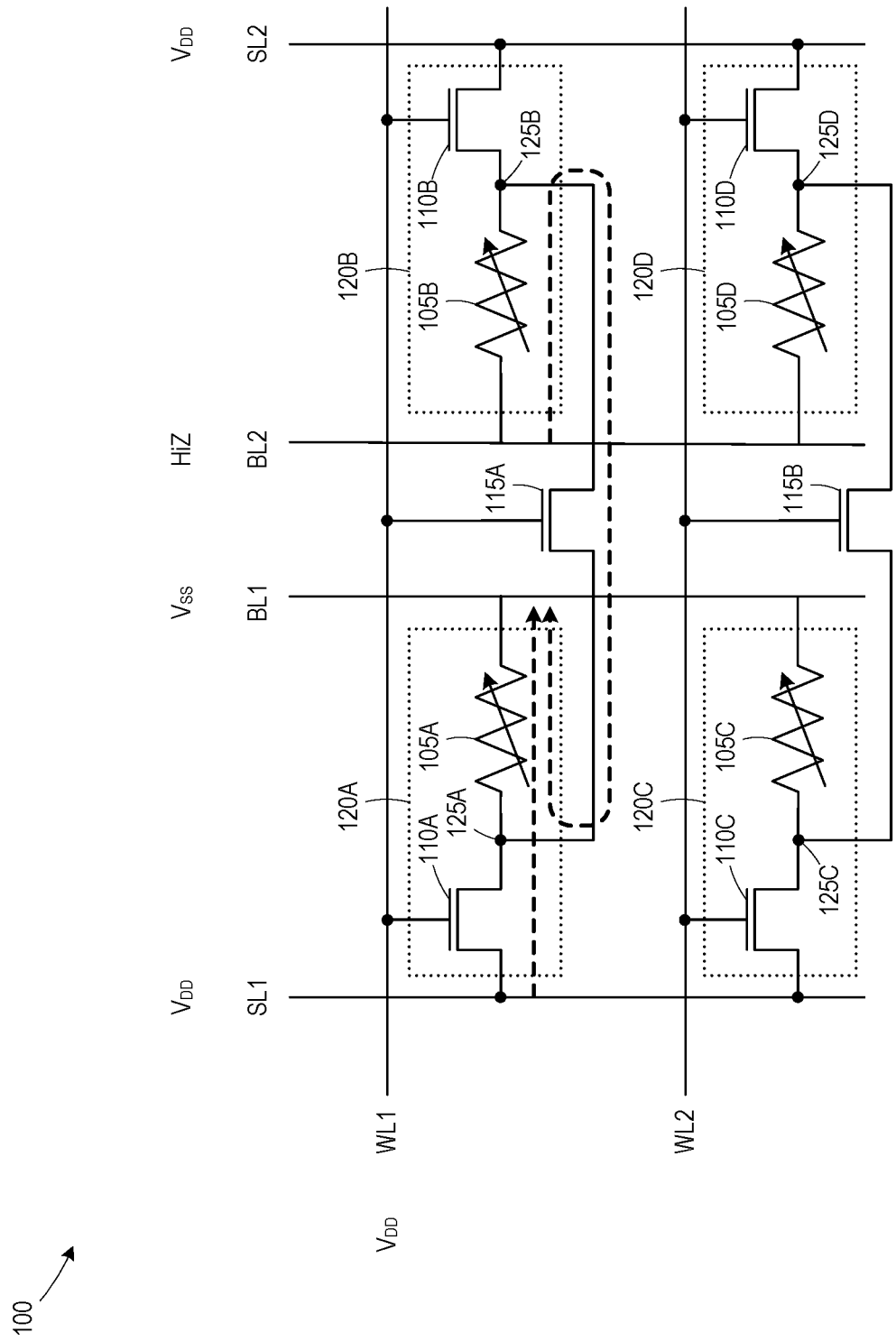
FIGS. 2 and 3 are diagrams illustrating the operation of the resistive memory device of FIG. 1 to implement write cycles, according to some embodiments.

FIG. 2 illustrates current flow in the resistive memory device 100 of FIG. 1 during a write operation that performs a switch from a low resistance state (LRS) to a high resistance state (HRS) in the resistive storage element 105A. A first voltage, $V_{DD}$, is applied to the source lines SL1, SL2 and the word line WL1. Activating the word line WL1 enables the access transistors 110A, 110B and the write assist transistor 115A. The bit line BL2 of the resistive storage element 105B not involved in the write operation is held at a high impedance state (HiZ) to isolate the resistive storage element 105B. A second voltage, $V_{SS}$ (e.g., ground), is applied to the bit line BL1 of the resistive storage element 105A. Current flows through the access transistor 110A and the access transistor 110B through the resistive storage element 105A to facilitate the write operation.

Figure 3:
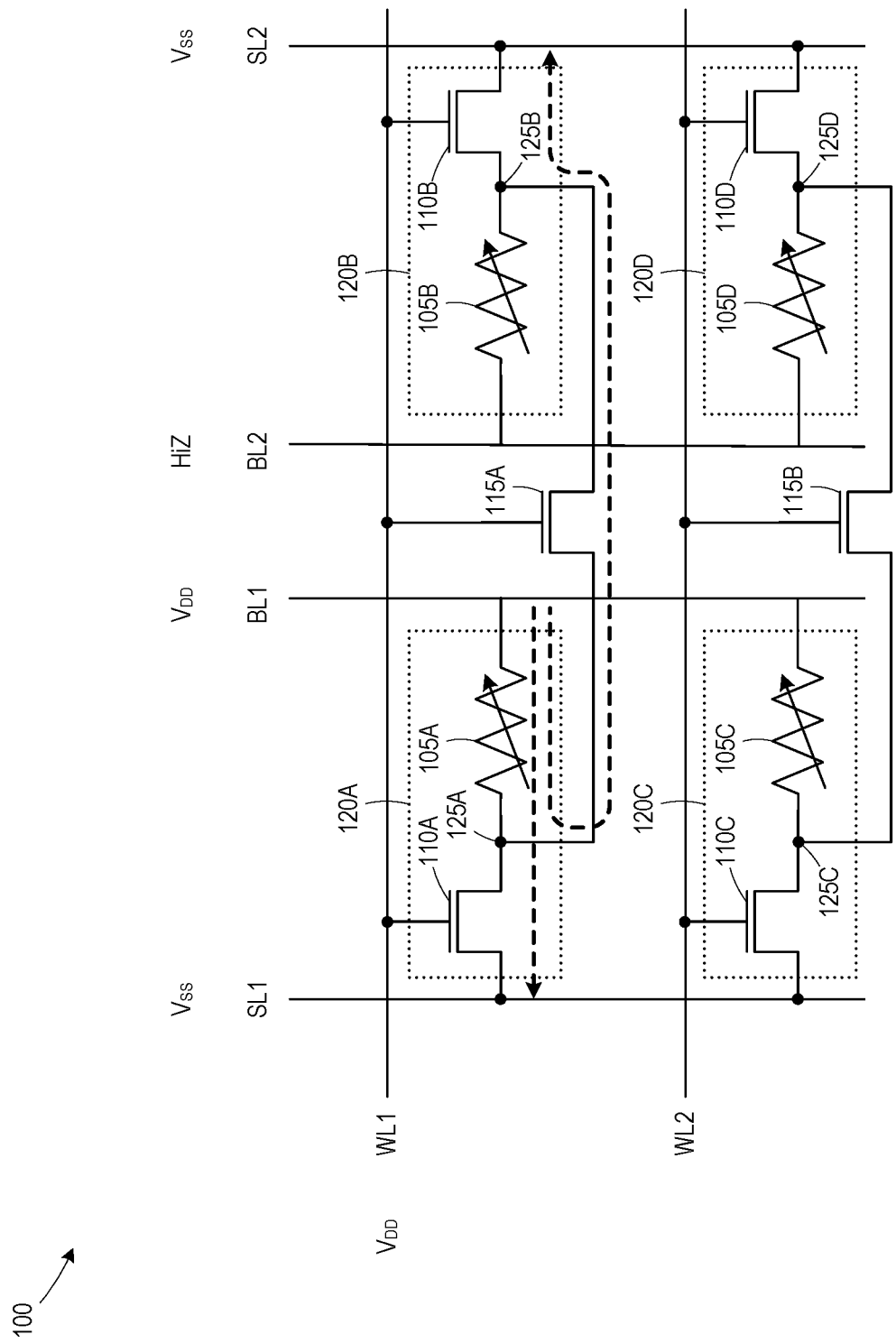

FIG. 3 illustrates current flow in the resistive memory device 100 of FIG. 1 during a write operation that performs an HRS to LRS switch in the resistive storage element 105A. A first voltage, $V_{DD}$, is applied to the bit line BL1 and the word line WL1. Activating the word line WL1 enables the access transistors 110A, 110B and the write assist transistor 115A. The bit line BL2 of the resistive storage element 105B not involved in the write operation is held at a high impedance state (HiZ) to isolate the resistive storage element 105B. A second voltage, $V_{SS}$ (e.g., ground), is applied to the source lines SL1, SL2. Current flows through the access transistor 110A and the access transistor 110B through the resistive storage element 105A in an opposite direction compared to FIG. 2 to facilitate the write operation.

Write operations to the resistive storage element 105B are performed in a similar manner to the technique illustrated in FIGS. 2 and 3 for the resistive storage element 105A with the voltages applied to the bit lines BL1, BL2 reversed. Read operations are performed by setting the bit line and the source line associated with the resistive storage element 105A, 105B not being read to high impedance states to provide isolation.

Figure 4:
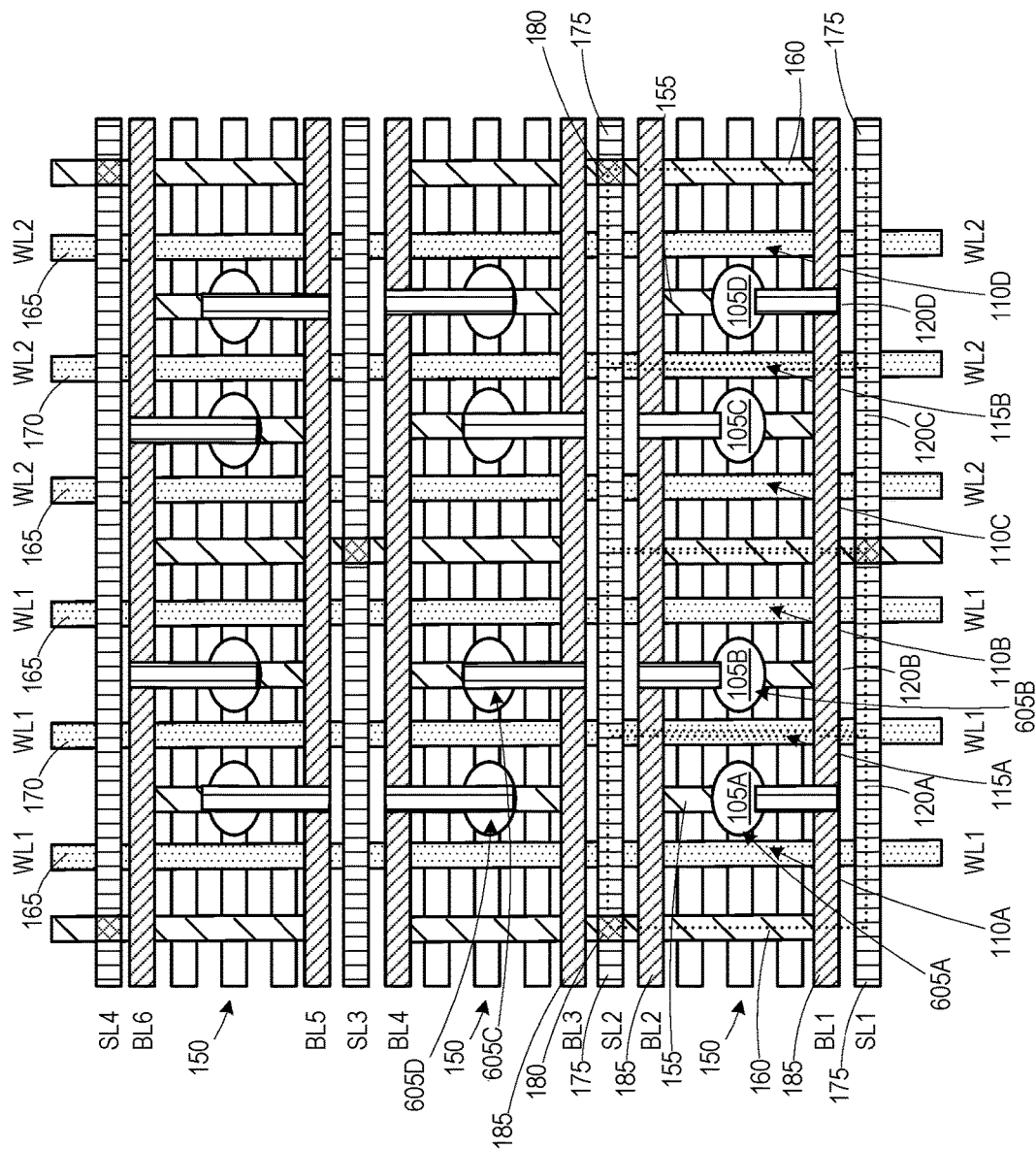
FIG. 4 is a layout diagram of a resistive memory device, according to some embodiments.

FIG. 4 is a layout diagram of the resistive memory device 100 of FIG. 1, according to some embodiments. Multiple layers are illustrated in FIG. 4, such as a logic level for implementing the transistors 110A-110D, 115A, 115B and word lines WL1, WL2 and one or more metallization layers for implementing the source lines SL1, SL2, the resistive storage elements 105A-105D, and the bit lines BL1, BL2. For ease of illustration, not all features of an actual device are illustrated. For example, dielectric layers are typically provided between the layers and various conductive interconnect structures are provided to connect devices in different levels.

Referring to FIG. 4, the transistors 110A-110D, 115A, 115B are finFET devices including fins 150. Source/drain contacts 155, 160 couple source/drain regions of the fins 150. The word lines WL1, WL2 are gate structures 165, 170 formed over channel portions of the fins 150. The gate structures 165 are associated with the access transistors 110A-110D, and the gate structures 170 are associated with the write assist transistors 115A, 115B. In some embodiments, the gate structures 165, 170 are interconnected to one another. In some embodiments, the gate structures 165 are interconnected to one another, but the gate structure 170 is controlled separately. The source lines SL1, SL2 are formed by conductive lines 175 positioned in a first metallization layer above the fins 150 and gate structures 165, 170. Vias 180 couple the conductive lines 175 to the source/drain contacts 160. In some embodiments, the resistive storage elements 105A-105D are positioned in the first metallization layer. Lower terminals of the resistive storage elements 105A-105D contact the respective source/drain contacts 155. The bit lines BL1, BL2 are implemented by conductive lines 185 in a second metallization layer above the resistive storage elements 105A-105D. Conductive lines 190 positioned in the second metallization layer couple upper terminals of the resistive storage elements 105A-105D to the conductive lines 185. In some embodiments, the conductive lines 190 extend over an upper surface of the resistive storage elements 105A-105D, but the labeled resistive storage elements 105A-105D are not illustrated as such to avoid obscuring the resistive storage elements 105A-105D in FIG. 4.

Figure 5:
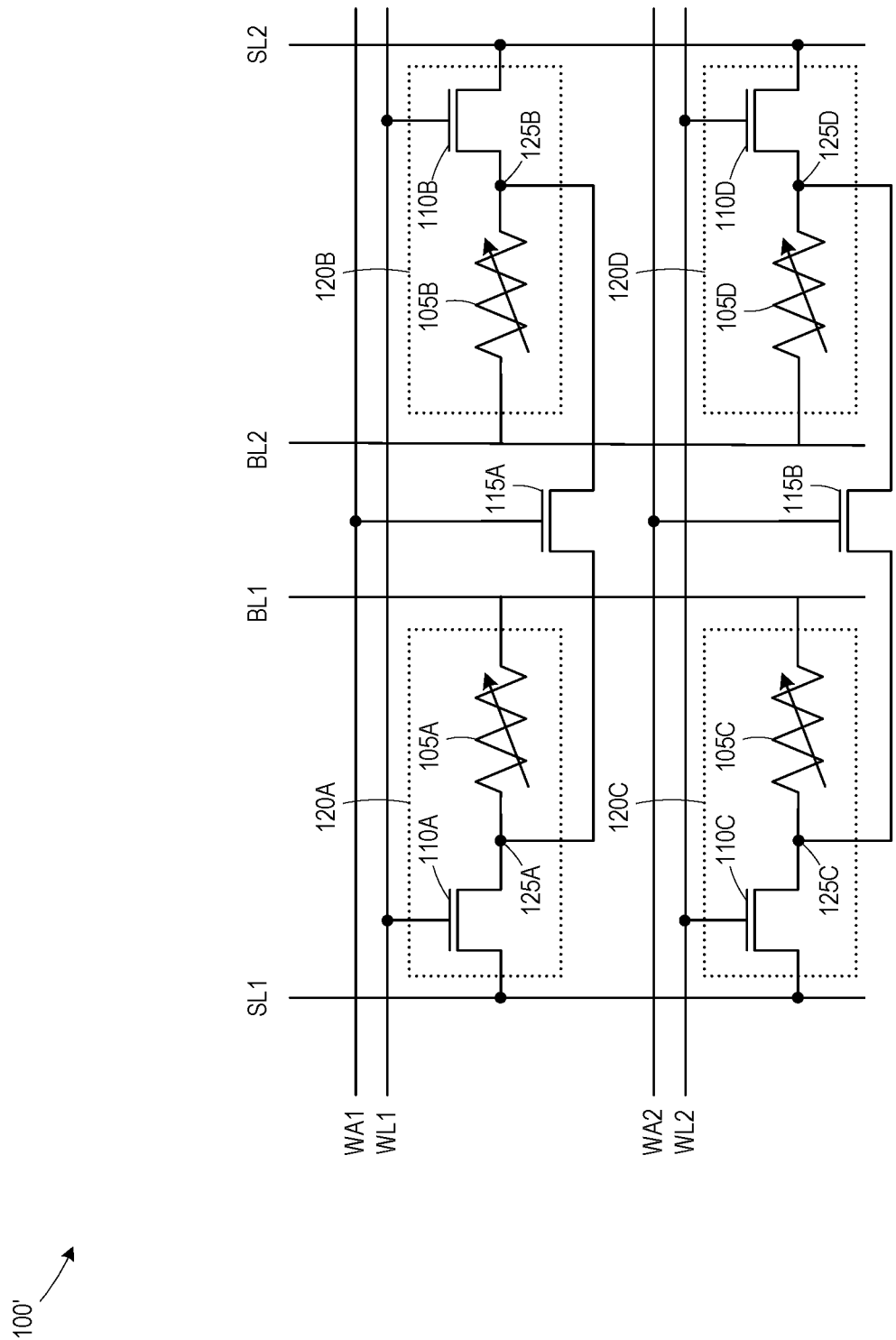
FIGS. 5 and 6 are circuit diagrams of alternative embodiments of resistive memory devices, according to some embodiments.

FIG. 5 is a circuit diagram of an alternative embodiment of a resistive memory device 100', according to some embodiments described herein. The resistive memory device 100' of FIG. 5 is similar to the resistive memory device 100 of FIG. 1, with the exception that the write assist transistors 115A, 115B are coupled to separate write assist lines WA1, WA2 as opposed to being connected to the same word lines WL1, WL2 at their respective access transistors 110A-110D. This arrangement allows the enable signals to be selectively applied to the write assist lines WA1, WA2 to enable the write assist transistors 115A, 115B only during write operations. As a result, the resistive storage elements 105A, 105B and the resistive storage elements 105C, 105D remain isolated from one another during read operations.

Figure 6:
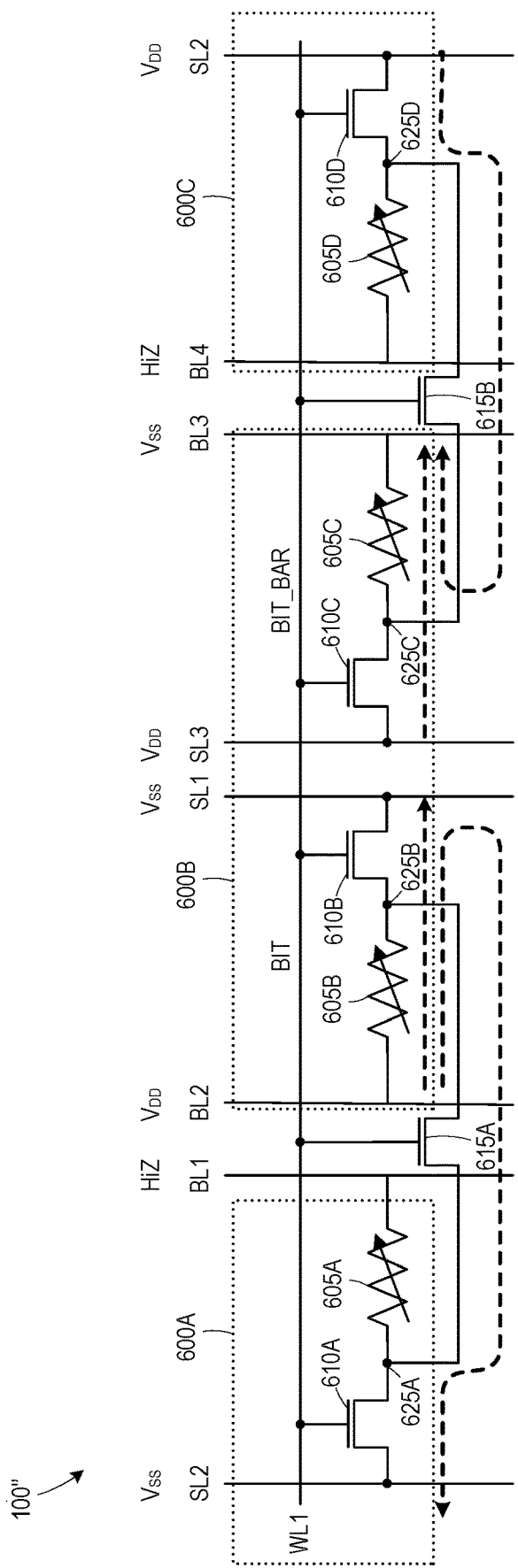

FIG. 6 is a circuit diagram of an alternative embodiment of a resistive memory device 100", according to some embodiments described herein. The resistive memory device 100" of FIG. 6 illustrates the devices described herein can be used for constructing differential cells 600A-600C. A differential cell 600A-600C consists of two access transistors 610B, 610C and two resistive storage elements 605B, 605C, where one storage element 605B stores the data (BIT), and the other storage element 605C stores its complement (BIT BAR). Storing the data in two resistive storage elements 605B, 605C improves the sense margin, compared to single element. The resistive storage element 605B shares an access transistor 610A from the neighboring cell 600A via write assist transistor 615A, and the resistive storage element 605C shares an access transistor 610D from the neighboring cell 600C via write assist transistor 615B. In the layout of FIG. 4, the resistive storage element 605A corresponds to the resistive storage element 105A, the resistive storage element 605B corresponds to the resistive storage element 105B, the resistive storage element 605C corresponds to the resistive storage element positioned directly above the resistive storage element 105B, and the resistive storage element 605D corresponds to the resistive storage element positioned directly above the resistive storage element 105A.

The resistive memory devices 100, 100', 100" described herein have numerous advantages. Sharing the access transistors between adjacent cells increases the available write current for a given device size. As a result, the size of the access transistor can be reduced without sacrificing write margin. Reducing the transistor size reduces the cell footprint, thereby increasing device density.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

The invention claimed is:

1. A device comprising:
   a first resistive storage element;
   a first access transistor having a first terminal coupled to the first resistive storage element at a first node;
   a second resistive storage element;
   a second access transistor having a first terminal coupled to the second resistive storage element at a second node; and
   a write assist transistor having a first terminal coupled to the first node and a second terminal coupled to the second node.

2. The device of claim 1, further comprising a first word line coupled to a gate terminal of the first access transistor and a gate terminal of the second access transistor.

3. The device of claim 2, wherein the first word line is coupled to a gate terminal of the write assist transistor.

4. The device of claim 2, further comprising a write assist line coupled to a gate terminal of the write assist transistor.

5. The device of claim 2, further comprising:
   a first source line coupled to a second terminal of the first access transistor; and
   a second source line coupled to a second terminal of the second access transistor.

6. The device of claim 1, wherein the write assist transistor is physically positioned on a substrate between the first access transistor and the second access transistor.

7. The device of claim 6, further comprising a fin structure defined on the substrate, wherein the first access transistor comprises a first portion of the fin structure, the write assist transistor comprises a second portion of the fin structure adjacent the first portion, and the second access transistor comprises a third portion of the fin structure adjacent the second portion.

8. The device of claim 7, wherein the fin structure comprises a plurality of fins.

9. The device of claim 7, further comprising a first word line comprising a first gate structure positioned above the first portion, a second gate structure positioned above the second portion, and a third gate structure positioned above the third portion.

10. The device of claim 9, wherein the first and third gate structures are coupled to one another.

11. The device of claim 9, wherein the first, second, and third gate structures are coupled to one another.

12. A device comprising:
   a first resistive storage element;
   a first access transistor having a first terminal coupled to the first resistive storage element at a first node;
   a second resistive storage element;
   a second access transistor having a first terminal coupled to the second resistive storage element at a second node;
   a first write assist transistor having a first terminal coupled to the first node and a second terminal coupled to the second node;
   a third resistive storage element;
   a third access transistor having a first terminal coupled to the third resistive storage element at a third node;
   a fourth resistive storage element;
   a fourth access transistor having a first terminal coupled to the fourth resistive storage element at a fourth node;
   a second write assist transistor having a first terminal coupled to the third node and a second terminal coupled to the fourth node;
   a first word line coupled to gate terminals of the first and second access transistors; and
   a second word line coupled to gate terminals of the third and fourth access transistors.

13. The device of claim 12, wherein the first word line is coupled to a gate terminal of the first write assist terminal, and the second word line is coupled to a gate terminal of the second write assist transistor.

14. The device of claim 12, further comprising:
   a first write assist line coupled to a gate terminal of the first write assist transistor; and
   a second write assist line coupled to a gate terminal of the second write assist transistor.

15. The device of claim 12, further comprising:
   a first source line coupled to a second terminal of the first access transistor and a second terminal of the third access transistor; and
   a second source line coupled to a second terminal of the second access transistor and a second terminal of the fourth access transistor.

16. The device of claim 12, wherein the first, second, third, and fourth access transistors are physically positioned in a row on a substrate, the first write assist transistor is physically positioned on the substrate between the first access transistor and the second access transistor, and the second write assist transistor is physically positioned on the substrate between the third access transistor and the fourth access transistor.

17. The device of claim 12, wherein the first word line and the second word line are coupled together, the second resistive storage element, the third resistive storage element, the second access transistor, and the third access transistor are grouped as a differential memory cell, where the second resistive storage element is to store a bit value and the third resistive storage element is to store a compliment of the bit value.

18. A method of operating a device comprising a first resistive storage element, a first access transistor having a first terminal coupled to a first terminal of the first resistive storage element at a first node, a second resistive storage element, a second access transistor having a first terminal coupled to a first terminal of the second resistive storage element at a second node, and a write assist transistor having a first terminal coupled to the first node and a second terminal coupled to the second node, the method comprising:
   enabling the first access transistor, the second access transistor, and the write assist transistor during a first write operation to the first resistive storage element; and
   providing a second terminal of the second resistive storage element at a high impedance state during the first write operation.

19. The method of claim 18, further comprising enabling the first access transistor and the second access transistor using a first word line coupled to gate terminals of the first access transistor and the second access transistor.

20. The method of claim 19, further comprising enabling the write assist transistor using a write assist line coupled to a gate terminal of the write assist transistor.

* * * * *